United States Patent
Cho et al.

(10) Patent No.: US 10,670,665 B2
(45) Date of Patent: Jun. 2, 2020

(54) METHOD FOR ESTIMATING REACTION OF SECONDARY BATTERY AND SECONDARY BATTERY COMPRISING BATTERY CELL USED FOR THE SAME

(71) Applicant: LG CHEM, LTD., Seoul (KR)

(72) Inventors: Hyung-Man Cho, Daejeon (KR); Sol-Nip Lee, Daejeon (KR); Song-Taek Oh, Daejeon (KR); Hyeok-Moo Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 78 days.

(21) Appl. No.: 16/083,434

(22) PCT Filed: Nov. 6, 2017

(86) PCT No.: PCT/KR2017/012495
§ 371 (c)(1),
(2) Date: Sep. 7, 2018

(87) PCT Pub. No.: WO2018/084675
PCT Pub. Date: May 11, 2018

(65) Prior Publication Data
US 2019/0094309 A1      Mar. 28, 2019

(30) Foreign Application Priority Data

Nov. 4, 2016   (KR) .................... 10-2016-0146826

(51) Int. Cl.
*G01R 31/36*      (2020.01)
*G01R 31/392*    (2019.01)
(Continued)

(52) U.S. Cl.
CPC ........... *G01R 31/392* (2019.01); *G01R 31/36* (2013.01); *G01R 31/396* (2019.01);
(Continued)

(58) Field of Classification Search
None
See application file for complete search history.

(56) References Cited

U.S. PATENT DOCUMENTS

| 8,679,677 B1 | 3/2014 | Tamaki et al. |
| 2004/0058250 A1 | 3/2004 | Kim et al. |

(Continued)

FOREIGN PATENT DOCUMENTS

| CN | 1484337 A | 3/2004 |
| CN | 102498609 A | 6/2012 |

(Continued)

OTHER PUBLICATIONS

Solchenbach et al., "A Gold Micro-Reference Electrode for Impedance and Potential Measurements in Lithium Ion Batteries," Journal of the Electrochemical Society, vol. 163, No. 10, 2016 (Published Aug. 19, 2016.), pp. A2265-A2272, XP055320415.

(Continued)

*Primary Examiner* — Jas A Sanghera
(74) *Attorney, Agent, or Firm* — Birch, Stewart, Kolasch & Birch, LLP

(57) ABSTRACT

The present disclosure is intended to design a secondary battery with improved boosting charge performance by estimating reaction in the thickness-wise direction of the electrode, and provides a method or estimating reaction of a secondary battery including (a) preparing a battery cell having a structure of first electrode/separator/reference electrode/separator/second electrode, wherein the second electrode has a structure of upper layer/porous film/lower layer, (b) setting a charging condition to estimate reaction of the battery cell, (c) measuring voltage and current of each of the upper layer, the lower layer and the battery cell while the set charging condition is reached, (d) after the charging condition, measuring an open-circuit voltage of the upper layer, the lower layer and the battery cell, and (e) comparatively (Continued)

analyzing a capacity obtained using the measured current with the measured open-circuit voltage, and a battery cell used for the same.

8 Claims, 7 Drawing Sheets

(51) Int. Cl.
  *H01M 10/42* (2006.01)
  *H01M 10/48* (2006.01)
  *G01R 31/396* (2019.01)
  *H01M 10/44* (2006.01)

(52) U.S. Cl.
  CPC ....... *H01M 10/4285* (2013.01); *H01M 10/44* (2013.01); *H01M 10/48* (2013.01)

(56) References Cited

U.S. PATENT DOCUMENTS

| | | | |
|---|---|---|---|
| 2005/0231894 A1* | 10/2005 | Yoshida | H01G 9/038 361/502 |
| 2010/0119907 A1 | 5/2010 | Shibata et al. | |
| 2012/0176097 A1 | 7/2012 | Takezawa et al. | |
| 2012/0293131 A1 | 11/2012 | Nakamura et al. | |
| 2013/0066573 A1 | 3/2013 | Bond et al. | |
| 2013/0323542 A1 | 12/2013 | Wijayawardhana et al. | |
| 2014/0375325 A1 | 12/2014 | Wang et al. | |
| 2014/0377651 A1 | 12/2014 | Kwon et al. | |
| 2015/0066407 A1 | 3/2015 | Joe et al. | |
| 2015/0160300 A1 | 6/2015 | Ishii et al. | |
| 2015/0263379 A1 | 9/2015 | Xiao et al. | |
| 2015/0280209 A1 | 10/2015 | Ohara et al. | |
| 2015/0357671 A1 | 12/2015 | Park et al. | |
| 2016/0028064 A1 | 1/2016 | Choi et al. | |
| 2016/0252582 A1 | 9/2016 | Iida et al. | |
| 2017/0059662 A1 | 3/2017 | Cha et al. | |
| 2018/0097255 A1 | 4/2018 | Jung et al. | |

FOREIGN PATENT DOCUMENTS

| | | |
|---|---|---|
| CN | 102593539 A | 7/2012 |
| CN | 103390764 A | 11/2013 |
| CN | 104600240 A | 5/2015 |
| CN | 204375843 U | 6/2015 |
| CN | 105308786 A | 2/2016 |
| CN | 105393399 A | 3/2016 |
| JP | 2009-231189 A | 10/2009 |
| JP | 2013-61337 A | 4/2013 |
| JP | 2015-108579 A | 6/2015 |
| KR | 10-2005-0110145 A1 | 11/2005 |
| KR | 10-2012-0123346 A | 11/2012 |
| KR | 10-2013-0122543 A | 11/2013 |
| KR | 10-2013-0124326 A | 11/2013 |
| KR | 10-2015-0066464 A | 6/2015 |
| KR | 10-2016-0039364 A | 4/2016 |
| KR | 10-2016-0051198 A | 5/2016 |
| KR | 10-2016-0059688 A | 5/2016 |
| WO | WO 2008/139683 A1 | 11/2008 |
| WO | WO 2016/175560 A1 | 11/2016 |

OTHER PUBLICATIONS

International Search Report for PCT/KR2017/012495 (PCT/ISA/210) dated Feb. 5, 2018.

* cited by examiner

METHOD FOR ESTIMATING REACTION OF SECONDARY BATTERY AND SECONDARY BATTERY COMPRISING BATTERY CELL USED FOR THE SAME

TECHNICAL FIELD

The present application claims priority to Korean Patent Application No. 10-2016-0146826 filed in the Republic of Korea on Nov. 4, 2016, the disclosure of which is incorporated herein by reference.

The present disclosure relates to a method for estimating reaction of a secondary battery and a secondary battery comprising a battery cell used for the same.

BACKGROUND ART

Recently, with the technology development and the increasing demand for mobile devices, the demand for secondary batteries as a source of energy has also increased. Among secondary batteries, lithium secondary batteries with high energy density and voltage, a long cycle life and a low self-discharge rate have been developed. In addition, with the growth of the market of devices employing high capacity batteries, the demand for high capacity batteries is expanding, and there is a need for a higher capacity electrode design to manufacture lithium secondary batteries with high energy density, high output and high discharging voltage as a source of power for these devices.

However, due to the volume and weight of an electrode layer, these developed high capacity batteries reduce in energy density of all battery cells and experience non-uniformity of electrochemical reaction in an electrode active material layer.

When current or voltage is applied to a secondary battery, a concentration gradient of lithium ions takes place in the electrode, and this concentration gradient phenomenon in the electrode becomes severer with the increasing thickness of the electrode active material layer, causing deterioration in boosting charge characteristics. In addition, an electrochemical reaction preemptively occurs on the surface layer of the electrode that contacts with an electrolyte solution, and as a consequence, lithium metal is deposited on the surface layer while boosting charge.

As described above, because reactivity of lithium ions in the electrode active material layer is not uniform due to the thickness of the active material layer, a high-loading electrode is used to improve the battery performance, but nevertheless, in effect, only part of electrode active material participates in the battery reaction, so the battery performance is not improved as much as expected from the high-loading electrode.

Therefore, if quantitative measurements of electrochemical reaction non-uniformity in the thickness-wise direction of the electrode during the operation of the battery is possible, such measurements could be used as data in implementing design for optimization when applying a new material for enhanced boosting charge.

DISCLOSURE

Technical Problem

The present disclosure is designed under the background of the related art, and therefore the present disclosure is aimed at detecting a difference in current flow in the thickness-wise direction of an electrode to estimate electrochemical reaction uniformity, at the same time with obtaining the voltage curves of a positive electrode and a negative electrode.

Technical Solution

To achieve the object, the present disclosure prepares a battery cell with a thick electrode for simulation to investigate reaction estimation by forming thin electrodes using a porous current collector (perforated sheet) and laminating them. Subsequently, an electrochemical reaction difference in a real electrode is inferred by comparatively analyzing the current flowing in each thin electrode layer.

Additionally, the voltage curves of the positive electrode and the negative electrode may be separated by inserting a reference electrode manufactured by coating a lithium titanium oxide ($Li_4Ti_5O_{12}$) active material on a thin copper line between the positive electrode and the negative electrode. Further, the quantity of lithium ions in the active material may be inferred and analyzed from differences in an amount of current flow (capacity) and voltage by comparing OCV values of each electrode layer.

More specifically, according to a first embodiment of the present disclosure, there is provided (a) a battery cell having a structure of first electrode/separator/reference electrode/separator/second electrode, wherein the second electrode has a structure of upper layer/porous film/lower layer, and each of the first electrode, the upper layer of the second electrode, and the lower layer of the second electrode has an active material layer on a current collector, and an electrode tab extends from each current collector.

According to a second embodiment of the present disclosure, a method for estimating lithium ion reactivity in the thickness-wise direction of a second electrode in a lithium secondary battery includes (a) preparing a battery cell having a structure of first electrode/separator/reference electrode/separator/second electrode, wherein the second electrode has a structure of upper layer/porous film/lower layer, each of the first electrode, the upper layer of the second electrode, and the lower layer of the second electrode has an active material layer on a current collector, and an electrode tab extends from each current collector, (b) connecting the tabs drawn from each of the first electrode, the upper layer of the second electrode, and the lower layer of the second electrode to an electrochemical analysis apparatus, (c) determining a condition for charging, and measuring current of each of the upper layer of the second electrode and the lower layer of the second electrode and voltage and current of the battery cell during charging, (d) after the charging is finished, measuring an open-circuit voltage of the upper layer of the second electrode, the lower layer of the second electrode, and the battery cell, and (e) comparatively analyzing a capacity obtained using the measured current with the measured open-circuit voltage.

According to a third embodiment of the present disclosure, in the first or second embodiment, the first electrode may be a negative electrode and the second electrode may be a positive electrode, or the first electrode may be a positive electrode and the second electrode may be a negative electrode.

According to a fourth embodiment of the present disclosure, in any one of the first and second embodiments, the reference electrode may be lithium metal.

According to a fifth embodiment of the present disclosure, in any one of the first to fourth embodiments, the porous film may have larger porosity than each of the upper layer of the second electrode and the lower layer of the second electrode.

According to a sixth embodiment of the present disclosure, in any one of the first to fifth embodiments, the porous film may be a porous polymer film made of polyolefin-based polymers such as ethylene homopolymer, propylene homopolymer, ethylene/butene copolymer, ethylene/hexene copolymer and/or ethylene/methacrylate copolymer, used singly or in combination; laminate structures consisting of such two or more porous polymer film; or a porous nonwoven such as high melting point glass fibers and polyethyleneterephthalate.

According to a seventh embodiment of the present disclosure, in any one of the first to sixth embodiments, the current may be accumulated from an initial time, a critical time during which the cumulative current value resides within a critical range may be calculated, an average voltage value for the period of a calculation time from the initial time to the critical time may be calculated, and the open-circuit voltage may be estimated based on the calculated average voltage value.

According to an eighth embodiment of the present disclosure, in any one of the first to seventh embodiments, the critical time may be calculated as the time when the cumulative current value is 0.

According to a ninth embodiment of the present disclosure, in any one of the first to eighth embodiments, the calculation time may calculate the time when a sign of the cumulative current value changes as the critical lime.

Advantageous Effects

According to an aspect of the present disclosure, reaction uniformity or reactivity in the thickness-wise direction of the electrode can be estimated, so the battery design can be improved with reference to the estimation results. Additionally, it is possible to design a secondary battery with improved boosting charge performance of a high-loading electrode.

BRIEF DESCRIPTION OF DRAWINGS

The accompanying drawings illustrate an embodiment of the present disclosure, and together with the following description, serve to provide further understanding of the technical aspects of the present disclosure. However, the present disclosure should not be construed as being limited to the drawings.

BEST MODE FOR CARRYING OUT THE INVENTION

Figure 1:
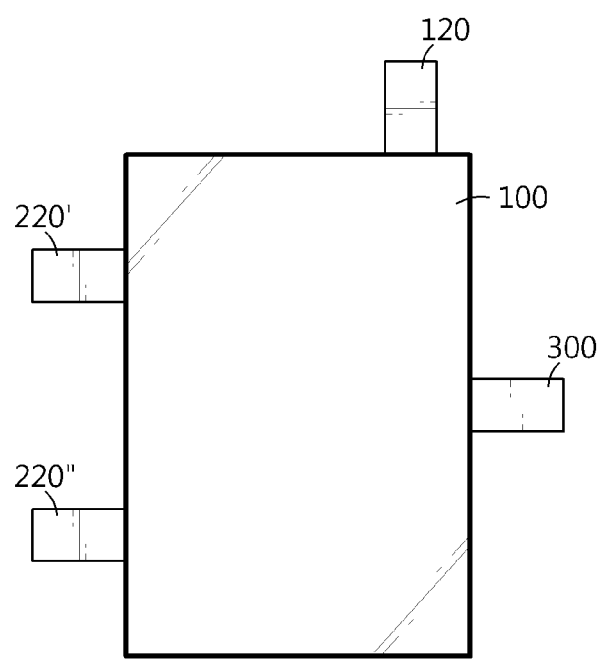
FIG. 1 is a schematic top view showing a battery cell according to an embodiment of the present disclosure.

Hereinafter, the embodiments of the present disclosure will be described with reference to the accompanying drawings. Prior to the description, the terms or words used in the specification and the appended claims shall not be construed as limited to general and dictionary meanings, but interpreted based on the meanings and concepts corresponding to technical aspects of the present disclosure on the basis of the principle that the inventor is allowed to define terms appropriately for the best explanation. Accordingly, the embodiments stated herein and the configuration depicted in the drawings are just an embodiment of the present disclosure, and do not represent all the technical aspects of the present disclosure, so it should be understood that many other equivalents and variations may be made thereto at the time of making the invention.

A 'battery cell' as used herein is not limited to a particular type, but as a specific example, includes a lithium secondary battery, such as Li-ion secondary battery, a Li-polymer secondary battery, or a Li-ion polymer secondary battery, having high energy density, discharging voltage and output stability advantages.

Figure 2:
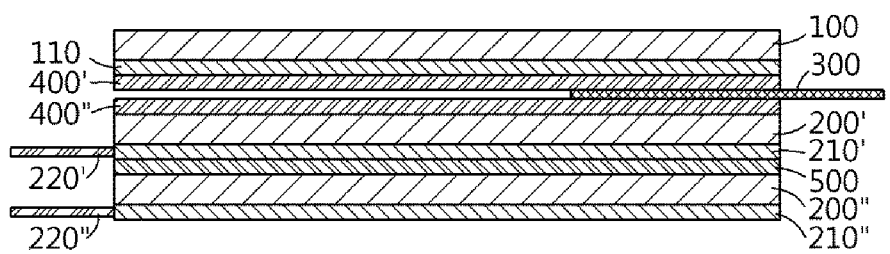
FIG. 2 is a schematic cross-sectional view showing a battery cell according to an embodiment of the present disclosure.

Describing with reference to FIGS. 1 and 2, a lithium secondary battery according to an embodiment of the present disclosure has a structure in which a first electrode formed by coating an active material layer 100 on one surface of an electrode current collector 110, a separator 400', 400", a reference electrode 300, and a second electrode are stacked in a sequential order.

In the specification, an electrode to measure lithium ion reactivity in the thickness-wise direction is referred to as a 'second electrode'. The second electrode may be a positive or negative electrode. When the first electrode is a positive electrode, the second electrode is a negative electrode, and when the first electrode is a negative electrode, the second electrode is a positive electrode.

The second electrode includes, on the basis of a porous film 500, an upper layer placed on the porous film 500, i.e., an electrode current collector 210' and an electrode active material layer 200' formed on one surface of the electrode current collector 210'; and a lower layer placed below the porous film 500, i.e., an electrode current collector 210" and an electrode active material layer 200" formed on one surface of the electrode current collector 210".

Each of the upper layer and the lower layer further includes an electrode tab 220', 220" extending from the electrode current collector.

The second electrode is such that for an electrode intended to manufacture or mass-produce, an active material slurry is divided into two or at a predefined ratio and coated on two electrode current collectors to form an upper layer of the second electrode and a lower layer of the second electrode. Alternatively, to manufacture or mass-produce an electrode having a positive electrode active material layer with a predefined height, for example, 20 μm thickness, loaded on an aluminum foil for a positive electrode current collector, an upper layer of the second electrode and a lower layer of the second electrode each of which has a 10 μm thick positive electrode active material layer on the aluminum foil may be prepared.

Recently, a double layer electrode that is manufactured using two or more types of active material slurries (mixed electrode materials) for one electrode is proposed, and lithium ion reactivity of each active material layer that forms the double layer can be also measured according to the present disclosure. In this case, each of the upper layer of the second electrode and the lower layer of the second electrode may be manufactured using an active material slurry for forming the double layer. The double layer may be formed with varying one or more component requirements, for example, active material type (kind), conductive material type, binder type, active material grain size, conductive material grain size and binder grain size, but the present disclosure is not limited thereto.

According to an embodiment of the present disclosure, the porous film is interposed between the upper layer and the lower layer.

The porous film of the present disclosure is preferably manufactured with a sufficient size to cover the upper layer of the second electrode and the lower layer of the second electrode, and preferably has pores uniformly formed all over the porous film.

In the present disclosure, the porous film has pores that should be formed not to impede the movement of lithium ions between the upper layer and the lower layer. To this end, for example, the pores of the porous film have a larger size than the pores of the upper layer of the second electrode and the pores of the lower layer of the second electrode. Additionally, the porous film of the present disclosure preferably has pores formed uniformly over the entire film. When considering this, the porosity of the porous film of the present disclosure is preferably higher than porosity on the surface layer of the upper layer of the second electrode and porosity on the surface layer of the lower layer of the second electrode. While satisfying the above-mentioned requirements, the porous film may have the longest pore diameter of 0.01 to 50 μm, 0.01 to 10 μm, or 0.01 to 5 μm, and porosity of 10 to 95%, 20 to 50% or 30 to 40%. In this instance, the pore is not limited to a particular shape, and may have, for example, circular, elliptical and/or long oval shapes.

Additionally, the porous film of the present disclosure is preferably as thin as possible to prevent it from acting as resistance. For example, the thickness may range 10 nm~10 μm or 10 nm~μm, but is not limited thereto.

The porous film of the present disclosure includes porous polymer films made of polyolefin-based polymers such as ethylene homopolymer, propylene homopolymer, ethylene/butene copolymer, ethylene/hexene copolymer and/or ethylene/methacrylate copolymer, used singly or in combination; laminate structures consisting of such two or more porous polymer film; or porous nonwovens such as high melting point glass fibers and polyethyleneterephthalate.

Because the porous film of the present disclosure is not used for commercial products, it is important to manufacture the porous film with lowest resistance rather than safety. In this aspect, the porous film of the present disclosure may not include a binder polymer for forming an electrode adhesive layer and/or ceramic for improving heat resistance or mechanical strength.

The positive electrode may be manufactured by, for example, applying a mixture of a positive electrode active material, a conductive material and a binder to one or two surfaces of a positive electrode current collector and drying it, and a filler may be added to the mixture when necessary.

The positive electrode current collector may be generally 3 to 500 μm thick. However, when the positive electrode is the second electrode, the positive electrode current collector used in the upper layer may be thinner to prevent the reaction estimation accuracy from lowering. For example, the positive electrode current collector may be 1 to 20 μm or 1 to 10 μm thick. The positive electrode current collector is not limited to any particular type when it has high conductivity while not causing a chemical reaction to the corresponding battery, and may include, for example, stainless steel, aluminum, nickel, titanium, sintered carbon, or aluminum or stainless steel having a surface treated with carbon, nickel, titanium and/or silver. The positive electrode current collector may have fine surface texture to improve the adhesion of the positive electrode active material, and is porous to allow for smooth movement of lithium ions.

The positive electrode tab may extend from the positive electrode current collector.

The positive electrode active material includes, but is not limited to, layered compounds such as lithium cobalt oxide ($LiCoO_2$) and lithium nickel oxide ($LiNiO_2$) or compounds with one or more transition metal substitution; lithium manganese oxide of chemical formula $Li_{1+x}Mn_{2-x}O_4$ (x=0~0.33), $LiMnO_3$, $LiMn_2O_3$, $LiMnO_2$; lithium copper oxide ($Li_2CuO_2$); vanadium oxide such as $LiV_3O_8$, $LiFe_3O_4$, $V_2O_5$, $Cu_2V_2O_7$; Ni-site lithium nickel oxide represented by chemical formula $LiNi_{1-x}M_xO_2$ (M=Co, Mn, Al, Cu, Fe, Mg, B or Ga, x=0.01~0.3); lithium manganese composite oxide represented by chemical formula $LiMn_{2-x}M_xO_2$ (M=Co, Ni, Fe, Cr, Zn or Ta, x=0.01=0.1) or $Li_2Mn_3MO_8$ (M=Fe, Co, Ni, Cu or Zn); $LiMn_2O_4$ with partial substitution of alkali earth metal ion for Li in chemical formula; disulfide compounds; and $Fe_2(MoO_4)_3$.

The conductive material is generally added in an amount of 1 to 30 weight % based on the total weight of the mixture including the positive electrode active material. The conductive material is not limited to any particular type when the material has conductivity while not causing a chemical change to the corresponding battery, and may include, for example, graphite such as natural graphite or artificial graphite; carbon black such as carbon black, acetylene black, ketjen black, channel black, furnace black, lamp black and thermal black; conductive fiber such as carbon fiber or metal fiber; metal powder such as fluorocarbon, aluminum and nickel powder; conductive whisky such as oxide zinc and potassium titanate; conductive metal oxide such as titanium oxide; conductive materials such as polyphenylene derivatives.

The binder assists in binding the active material to the conductive material and to the current collector, and is generally added in an amount of 1 to 30 weight % based on the total weight of the mixture including the positive electrode active material. Examples of the binder may include, polyvinylidene fluoride, polyvinyl alcohol, carboxymethyl cellulose (CMC), starch, hydroxypropyl cellulose, regenerated cellulose, polyvinylpyrrolidone, tetrafluoroethylene, polyethylene, polypropylene, ethylene-propylene-diene ter polymer (EPDM), sulfonated EPDM, styrene-butadiene rubber, fluorine rubber, and a variety of copolymers.

The filler is a substance that is optionally used to suppress the expansion of the positive electrode, and is not limited to any particular type when it is a fibrous material while not causing a chemical change to the corresponding battery, and may include, for example, olefin-based polymers such as polyethylene and polypropylene; fibrous materials such as glass fiber and carbon fiber.

The negative electrode is manufactured by applying a negative electrode active material to one or two surfaces of a negative electrode current collector and drying it, and the above-mentioned components may be optionally added when necessary.

The negative electrode current collector is generally 3 to 500 μm thick. However, when the negative electrode is the second electrode, the negative electrode current collector used in the upper layer may be thinner to prevent the reaction estimation accuracy from lowering. For example, the negative electrode current collector may be 1 to 20 μm or 1 to 10 μm thick. The negative electrode current collector is not limited to any particular type when it has conductivity while not causing a chemical reaction to the corresponding battery, and may include, for example, copper, stainless steel, aluminum, nickel, titanium, sintered carbon, copper or stainless steel having a surface treated with carbon, nickel, titanium and silver, and aluminum-cadmium alloys. Additionally, similar to the positive electrode current collector, the negative electrode current collector may have fine surface texture to increase the bond strength of the negative electrode active material, and is porous to allow for smooth movement of lithium ions.

The negative electrode tab may extend from the negative electrode current collector.

The negative electrode active material may include, for example, carbon such as non-graphitizable carbon and graphite-based carbon; metal composite oxide such as $Li_xFe_2O_3(0 \leq x \leq 1)$, $Li_xWO_2(0 \leq x \leq 1)$, $Sn_xMe_{1-x}Me'_yO_z$ (Me: Mn, Fe, Pb, Ge; Me': Al, B, P, Si, elements of Groups 1, 2 and 3 in the periodic table, halogen; $0 < x \leq 1$; $1 \leq y \leq 3$; $1 \leq z \leq 8$); lithium metal; lithium alloys; silicon-based alloys; tin-based alloys; metal oxide such as $SnO$, $SnO_2$, $PbO$, $PbO_2$, $Pb_2O_3$, $Pb_3O_4$, $Sb_2O_3$, $Sb_2O_4$, $Sb_2O_5$, $GeO$, $GeO_2$, $Bi_2O_3$, $Bi_2O_4$, and $Bi_2O_5$; conductive polymer such as polyacetylene; and Li—Co—Ni-based materials.

The separator is interposed between the positive electrode and the negative electrode, and an insulating thin film having high ion permeability and mechanical strength is used. The separator generally has a pore diameter of 0.01~10 micrometers, and generally has a thickness of 5~300 micrometers. The separator includes separators commonly used in the art, and includes, for example, organic/inorganic composite porous safety-reinforcing separators (SRS) coated with a mixture of inorganic particles and a binder polymer on at least one surface of a porous substrate; for example, chemical-resistant and hydrophobic olefin-based polymer such as polypropylene; sheets or nonwovens made of glass fiber or polyethylene. When a solid electrolyte such as polymer electrolyte is used as the electrolyte, the solid electrolyte may serve as the separator.

After the electrode assembly or battery cell of the present disclosure is received in a battery case such as a pouch-type battery case, and an electrolyte solution is injected thereinto, reaction estimation may be performed.

The electrolyte solution may be a lithium salt containing nonaqueous electrolyte solution, and includes a nonaqueous electrolyte solution and a lithium salt. The nonaqueous electrolyte solution includes a nonaqueous organic solvent, an organic solid electrolyte and an inorganic solid electrolyte, but is not limited thereto.

The nonaqueous organic solvent may include, for example, aprotic organic solvents such as N-methyl-2-pyrrolidinone, propylene carbonate, ethylene carbonate, butylene carbonate, dimethyl carbonate, diethyl carbonate, gamma butyrolactone, 1,2-dimethoxy ethane, tetrahydroxy franc, 2-methyl tetrahydrofuran, dimethylsulfoxide, 1,3-dioxolane, formamide, dimethylformamide, dioxolane, acetonitrile, nitromethane, methyl formate, methyl acetate, phosphoric acid triester, trimethoxy methane, dioxolane derivatives, sulfolane, methyl sulfolane, 1,3-dimethyl-2-imidazolidinone, propylene carbonate derivatives, tetrahydrofuran derivatives, ether, methyl propionate, and ethyl propionate.

The organic solid electrolyte may include, for example, polyethylene derivatives, polyethylene oxide derivatives, polypropylene oxide derivatives, phosphoric acid ester polymers, poly agitation lysine, polyester sulfide, polyvinyl alcohols, polyvinylidene fluoride, and polymers containing ionic dissociation groups.

The inorganic solid electrolyte may include, for example, nitrides, halides and sulfates of Li such as $Li_3N$, $LiI$, $Li_5NI_2$, $Li_3N$—$LiI$—$LiOH$, $LiSiO_4$, $LiSiO_4$—$LiI$—$LiOH$, $Li_2SiS_3$, $Li_4SiO_4$, $Li_4SiO_4$—$LiI$—$LiOH$, and $Li_3PO_4$—$Li_2S$—$SiS_2$.

The lithium salt is a material that is apt to dissolve in the nonaqueous electrolyte, and may include, for example, $LiCl$, $LiBr$, $LiI$, $LiClO_4$, $LiBF_4$, $LiB_{10}Cl_{10}$, $LiPF_6$, $LiCF_3SO_3$, $LiCF_3CO_2$, $LiAsF_6$, $LiSbF_6$, $LiAlCl_4$, $CH_3SO_3Li$, $CF_3SO_3Li$, $(CF_3SO_2)_2NLi$, chloro borane lithium, lower aliphatic carboxylic acid lithium, lithium tetraphenyl borate, and/or imide.

Additionally, to improve the charging/discharging characteristics and flame retardancy, for example, pyridine, triethylphosphite, triethanolamine, cyclic ether, ethylene diamine, n-glyme, triamide hexaphosphate, nitrobenzene derivatives, sulfur, quinone imine dye, N-substituted oxazolidinone, N,N-substituted imidazolidine, ethylene glycol dialkyl ether, ammonium salts, pyrrole, 2-methoxy ethanol, and aluminum trichloride may be added to the nonaqueous electrolyte solution. In some cases, a halogen containing solvent such as carbon tetrachloride and trifluoroethylene may be added to give non-combustibility, carbon dioxide gas may be added to improve high temperature storage characteristics, and fluoro-ethylene carbonate (FEC) and/or propene sultone (PRS) may be added.

In a specific example, a lithium salt-containing nonaqueous electrolyte may be prepared by adding a lithium salt such as $LiPF_6$, $LiClO_4$, $LiBF_4$ and $LiN(SO_2CF_3)_2$ to a mixed solvent of cyclic carbonate which is a high dielectric constant solvent, for example, EC or PC, and linear carbonate which is a low-viscosity solvent, for example, DEC, DMC or EMC.

The reference electrode is installed to independently measure the potential of each of the positive electrode and the negative electrode of the secondary battery. One side of the reference electrode assembly is inserted into the battery cell or electrode assembly in the pouch case, and the other side is drawn out of the battery cell or electrode assembly.

Additionally, one side of the reference electrode may be preferably positioned at the center of the electrode assembly.

The reference electrode may include a reference electrode lead and lithium metal connected to one side of the reference electrode lead. Additionally, the reference electrode may further include an insulation film with which the lithium metal is enclosed.

The reference electrode lead is made of an elongated thin metal plate, and is not limited to a particular material when the material is a metal material with high conductivity, and for example, copper (Cu) or copper coated with nickel (Ni) may be used. When nickel (Ni)-coated copper is used for the reference electrode lead, copper provides high conductivity, and nickel coated on the surface of copper provides good corrosion resistance.

The lithium metal may be connected to the reference electrode lead, for example, such that the lithium metal wraps an end of one side in the lengthwise direction of the reference electrode lead. Additionally, in case that two separators are interposed between the positive electrode and the negative electrode that form the electrode assembly, the lithium metal may be inserted/interposed between the two separators. In case that one separator is interposed between the positive electrode and the negative electrode that form the electrode assembly, the insulation film may preferably surround the lithium metal of the reference electrode, and the reference electrode may be inserted/interposed between the positive electrode and the separator or between the negative electrode and the separator.

Lithium ions produced from the lithium metal move through the electrolyte solution filled in the battery case, and accordingly it is possible to individually measure the (relative) potential of the positive electrode or the negative electrode (to the lithium metal).

The insulation film may be used to prevent a short circuit caused by the contact of the reference electrode lead and the lithium metal with the electrode assembly, and may be formed such that it wraps the lithium metal. For the insulation film, a separation membrane may be used, and this is to secure free movement of lithium ions produced from the lithium metal, and the separation membrane may be made of the same material as the separator provided in the electrode assembly.

The separation membrane may include, for example, a flat porous substrate and inorganic particles and a surfactant bonded on at least one surface of the flat porous substrate by a binder.

Meanwhile, although the drawings show that the insulation film only wraps a region of the reference electrode lead in which the lithium metal is formed, the present disclosure is not limited thereto. That is, the insulation film may be formed such that it wraps even a region of the reference electrode lead in which the lithium metal is not formed, in order to completely prevent a short circuit risk between the battery cell or the electrode assembly and the reference electrode.

Additionally, the present disclosure provides a battery pack and device including one or more battery cells.

In addition, the secondary battery is not limited by the number of elements that make up the secondary battery. Accordingly, the secondary battery should be construed as including a single cell including an assembly of positive electrode/the separator/negative electrode in one package and an electrolyte, as well as an assembly of single cells, a module in which multiple assemblies are connected in series and/or in parallel, a pack in which multiple modules are connected in series and/or in parallel, and a battery system in which multiple packs are connected in series and/or in parallel.

In an embodiment, a method for estimating reaction of a secondary battery according to the present disclosure is performed in the process of predicting an electrochemical reaction difference in the thickness-wise direction of a real secondary battery before designing a secondary battery including a high-loading electrode.

Figure 3:
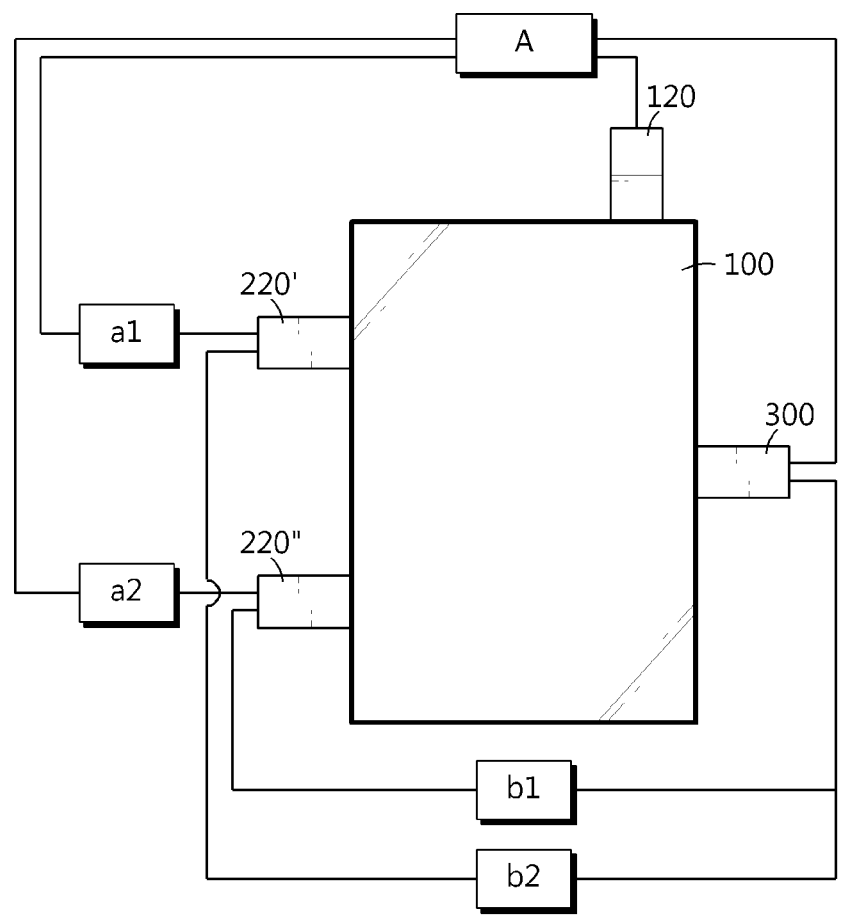
FIG. 3 is a schematic diagram showing a tab of a first electrode, an upper layer tab of a second electrode, a lower layer tab of the second electrode and a reference electrode, each of which is connected to an electrical analyzer, according to an embodiment of the present disclosure.

To estimate reaction of a secondary battery according to an embodiment of the present disclosure, describing with reference to FIG. 3, an electrode tab 120 of a first electrode and a reference electrode 300 are connected to a main electrical analyzer or a master electrical analyzer A, and each of an upper layer electrode tab 220' of a second electrode and a lower layer electrode tab 220" of the second electrode is connected to an auxiliary electrical analyzer or a slave electrical analyzer a1, a2. Additionally, to determine an OCV difference between the upper layer and the lower layer of the graph shown in FIG. 6, voltage is measured through each channel b1, b2.

The electrical analyzer available in the present disclosure may be an electrochemical equipment commonly used to measure the current and voltage in the art, for example, Bio-Logic Science Instrument's VMP3 (model).

Subsequently, a constant current is applied (input) up to the charge termination voltage in a master channel, and voltage of the battery cell is measured (output). In this instance, voltage curves of the positive electrode and the negative electrode are separated with the help of the reference electrode. Additionally, the current flowing in each of the upper layer and the lower layer of the second electrode during charging is measured. In this instance, when the experimental results reveal that a larger amount of current flows in the upper layer than the lower layer, it is estimated that lithium ion reactivity in the thickness-wise direction of the second electrode is not uniform. The charging capacity of the upper layer and the lower layer of the second electrode may be calculated by integrating the measured current amount.

Subsequently, an open-circuit voltage is measured. A method for measuring the open-circuit voltage includes measuring the charging/discharging current of the battery cell. Subsequently, the measured current is accumulated from the initial time. Subsequently, a critical time during which the cumulative current value resides within a critical range is calculated.

The current is accumulated from the initial time, the critical time during which the cumulative current value resides within the critical range is calculated, an average voltage value for the period of a calculation time from the initial time to the critical time is calculated, and the open-circuit voltage may be estimated based on the calculated average voltage value. In this instance, the calculated average voltage value is an average value of voltage values measured for the period from the initial time to the critical time. In other words, the average voltage value is an average value of voltage values measured for the calculation time.

The critical time may be calculated as the time when the cumulative current value is 0.

The calculation time may be calculated as the time when the sign of the cumulative current value changes.

In addition, in the method for estimating reaction of a secondary battery according to another embodiment of the present disclosure, the open-circuit voltage may refer to a value while an external electric bias such as current or voltage is absent in the battery cell, i.e., for the rest time.

MODE FOR CARRYING OUT THE INVENTION

Hereinafter, the embodiments are described in detail to explain the present disclosure more specifically. However, the embodiments according to the present disclosure may be modified in many other forms, and the scope of the present disclosure should not be construed as being limited to the following embodiments. The embodiments of the present disclosure are provided to explain the present disclosure more clearly and fully to those having ordinary knowledge in the art.

Example

A 93 μm thick positive electrode coated with a positive electrode active material layer including a three components (Ni, Mn, Co)-containing lithium oxide active material (LN- MCO) on one surface of an aluminum foil was prepared. For a reference electrode, a 60 µm thick lithium metal plate was prepared, and a 63 µm thick negative electrode coated with a negative electrode active material layer including artificial graphite on one surface of a copper foil was prepared.

A battery cell with a structure of positive electrode/separator/reference electrode/separator/negative electrode (upper layer)/porous film/negative electrode (lower layer) was manufactured.

Measurement of Non-Uniformity of Electrochemical Reaction

Non-uniformity of electrochemical reaction in the upper layer negative electrode and the lower layer negative electrode of the battery cell manufactured in example was measured.

Figure 4:
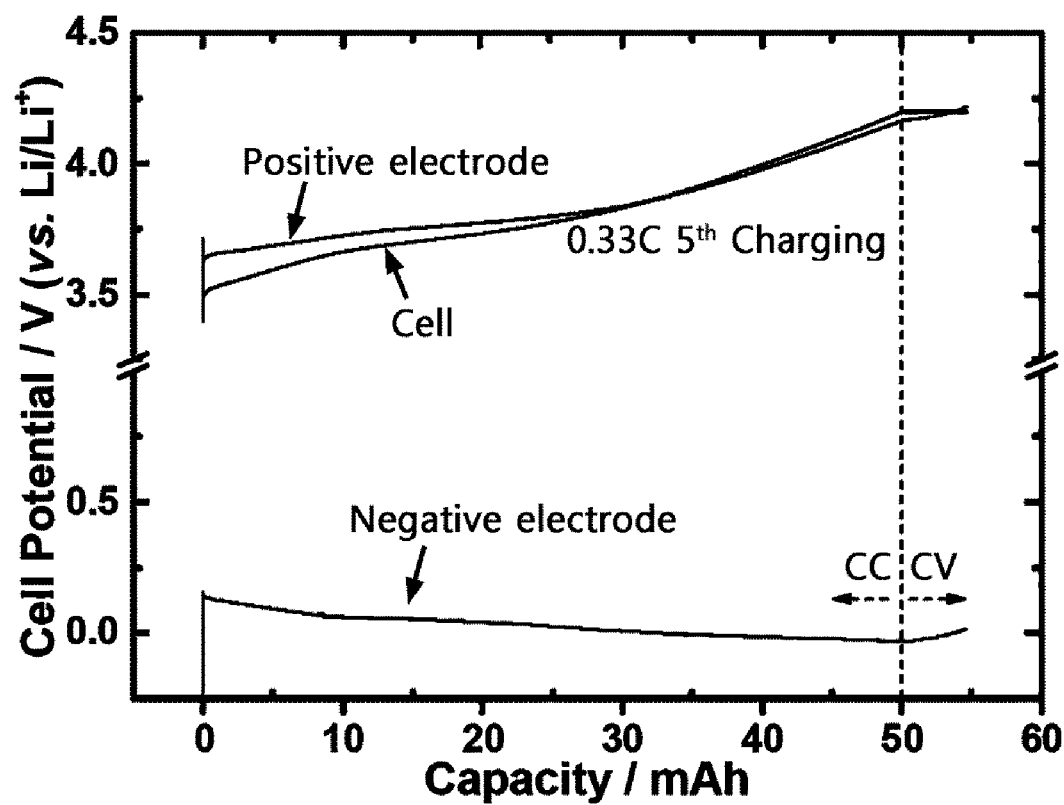
FIG. 4 is a graph showing the voltage curves during charging at 0.33 C-rate in example 1.

FIG. 4 is a graph showing the voltage curves during charging at 0.33 C-rate in example 1. Referring to FIG. 1, an electric current of 0.33 C-rate is applied (input) in a master channel, and voltage of the battery cell is measured (output). For an electrical analyzer, Bio-Logic Science Instrument's VMP3 (model) was used. In this instance, the voltage curves of the positive electrode and the negative electrode may be separated with the help of the reference electrode. Specifically, a voltage change in the negative electrode during charging may be observed.

Figure 5:
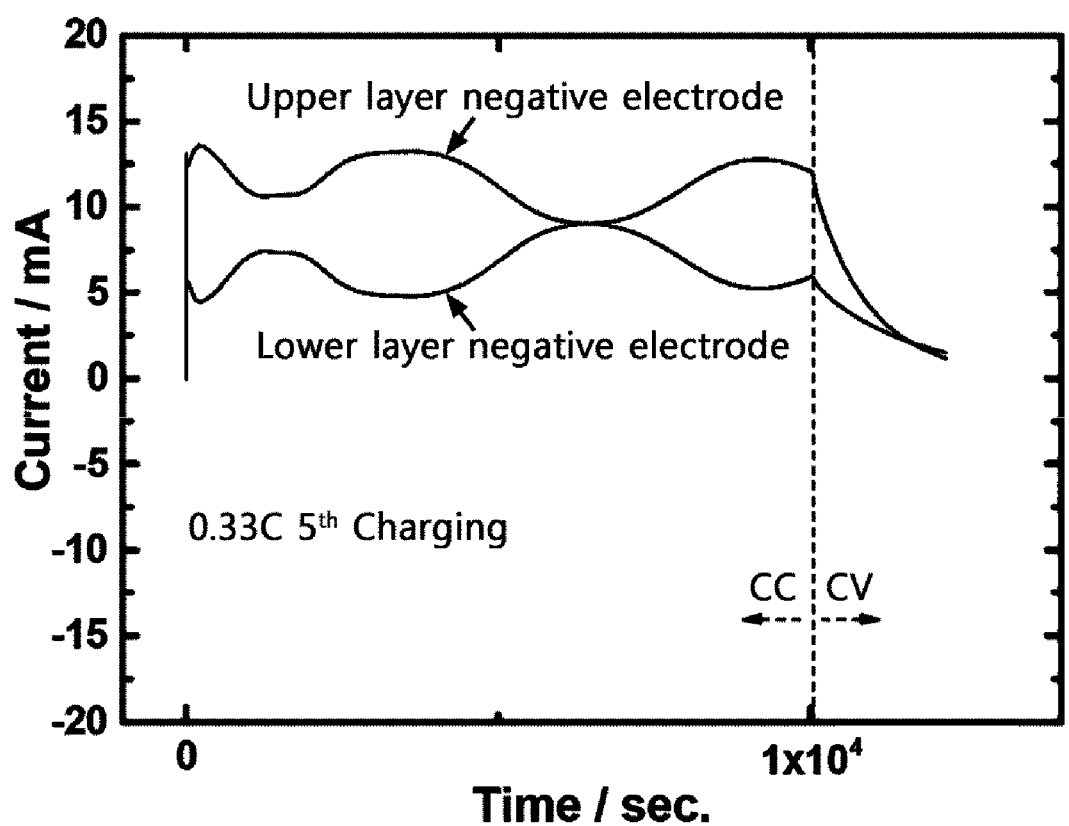
FIG. 5 is a graph showing the results of measuring the current flowing in a negative electrode upper layer and a negative electrode lower layer used as a second electrode in real time during charging in example 1.

FIG. 5 is a graph showing the results of measuring the current flowing in the upper layer negative electrode and the lower layer negative electrode in real time during charging according to example 1. Referring to FIG. 5, it can be seen that a larger amount of current flows in the upper layer than the lower layer. The charging capacity of the upper layer and the lower layer may be calculated by integrating the measured amount of current.

Figure 6:
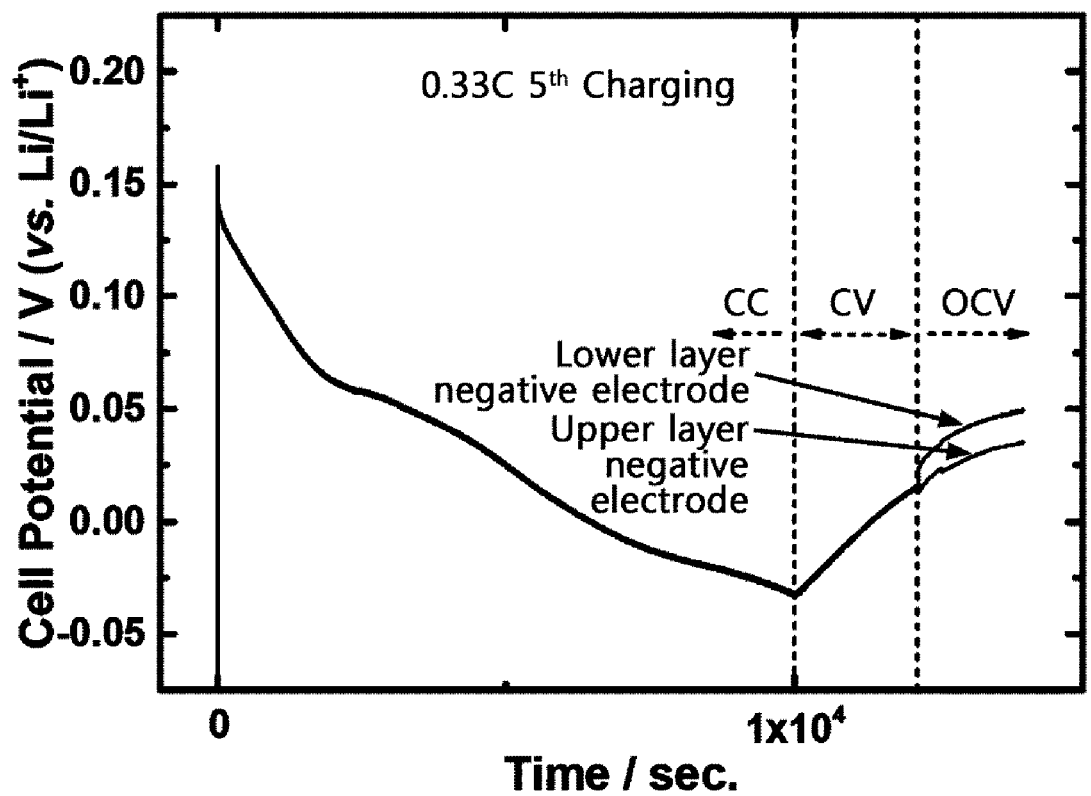
FIG. 6 is a graph showing the voltage curves of a negative electrode upper layer and a negative electrode lower layer used as a second electrode during charging at 0.33 C-rate in example 1.

FIG. 6 is a graph showing the voltage curves of the upper layer and the lower layer during charging according to example 1.

Figure 7:
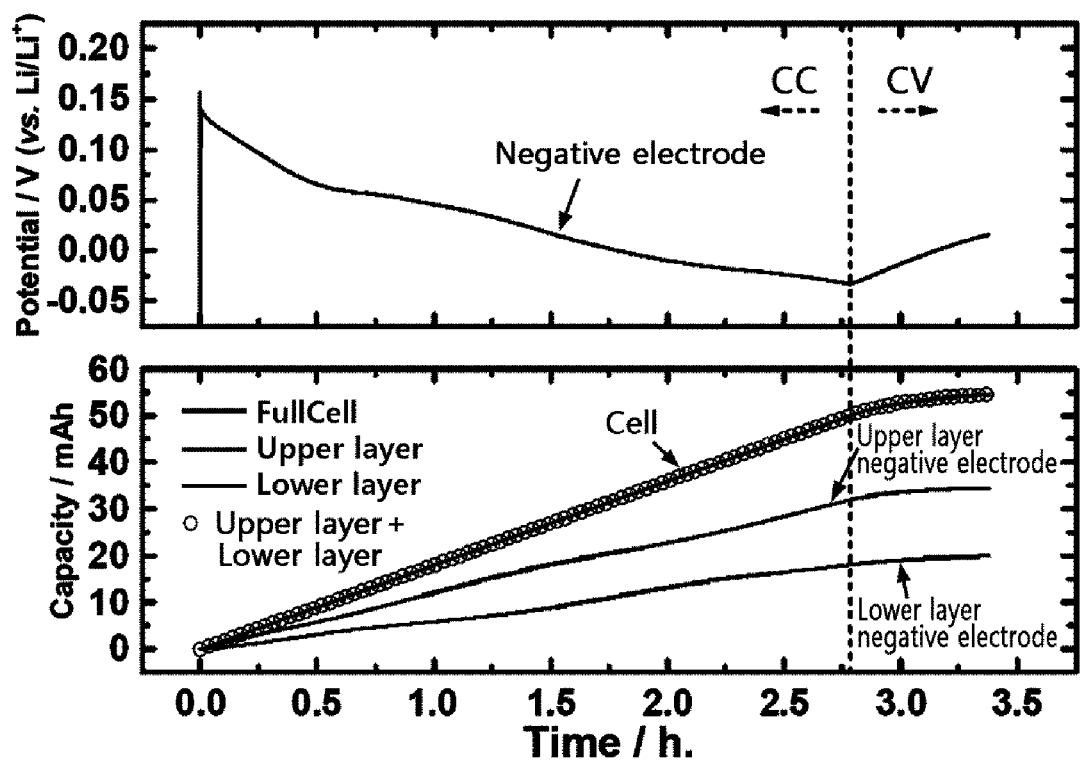
FIG. 7 is a graph showing a charging capacity distribution of an upper layer and a lower layer used as a second negative electrode during charging in example 1.

FIG. 7 is a graph showing a charging capacity distribution of the upper layer and the lower layer during charging according to example 1. Referring to FIG. 7, the graph labeled with Full cell shows the capacity directly measured by a master electrochemical analyzer, and the graph (indicated as o) labeled with "upper layer+lower layer" is calculated from a current value obtained from a slave electrochemical analyzer (corresponding to a1, a2 of FIG. 3), and as the Full cell graph and the "upper layer+lower layer" graph are found to have the same value, it can be seen that there is no error in the current value individually measured for each of the upper layer and the lower layer. Meanwhile, a difference in the voltage curves between the upper layer and the lower layer was not found during charging of the negative electrode, but in this instance, it can be seen that the lower layer is lower in the charged capacity than the upper layer. FIG. 6 shows a difference in OCV between the upper layer and the lower layer when there is no external electricity applied after the charging reaction is finished.

While the present disclosure has been hereinabove described with regard to a limited number of embodiments and drawings, the present disclosure is not limited thereto and it is obvious to those skilled in the art that various changes and modifications can be made thereto within the technical aspects of the present disclosure and the full scope of equivalents to which the appended claims are entitled.

What is claimed is:

1. A secondary battery comprising:
   (a) a battery cell having a structure of first electrode/separator/reference electrode/separator/second electrode, wherein the second electrode has a structure of upper layer/porous film/lower layer,
   each of the first electrode, the upper layer of the second electrode, and the lower layer of the second electrode has an active material layer on a current collector, and an electrode tab extends from each current collector.

2. A method for estimating reaction of a secondary battery, comprising:
   (a) preparing a battery cell having a structure of first electrode/separator/reference electrode/separator/second electrode, wherein the second electrode has a structure of upper layer/porous film/lower layer, each of the first electrode, the upper layer of the second electrode, and the lower layer of the second electrode has an active material layer on a current collector, and an electrode tab extends from each current collector;
   (b) connecting the tabs drawn from each of the first electrode, the upper layer of the second electrode, and the lower layer of the second electrode to a voltage and current measuring apparatus;
   (c) determining a condition for charging, and measuring current of each of the upper layer of the second electrode and the lower layer of the second electrode and voltage and current of the battery cell during charging;
   (d) after the charging is finished, measuring an open-circuit voltage of the upper layer of the second electrode, the lower layer of the second electrode, and the battery cell; and
   (e) comparatively analyzing a capacity obtained using the measured current with the measured open-circuit voltage.

3. The method for estimating reaction of a secondary battery according to claim 2, wherein the first electrode is a negative electrode and the second electrode is a positive electrode, or the first electrode is a positive electrode and the second electrode is a negative electrode.

4. The method for estimating reaction of a secondary battery according to claim 2, wherein the reference electrode is lithium metal.

5. The method for estimating reaction of a secondary battery according to claim 2, wherein the porous film has larger porosity than each of the upper layer of the second electrode and the lower layer of the second electrode.

6. The method for estimating reaction of a secondary battery according to claim 2, wherein the current is accumulated from an initial time, a critical time during which the cumulative current value resides within a critical range is calculated, an average voltage value for the period of a calculation time from the initial time to the critical time is calculated, and the open-circuit voltage is estimated as the calculated average voltage value.

7. The method for estimating reaction of a secondary battery according to claim 6, wherein the critical time is calculated as the time when the cumulative current value is 0.

8. The method for estimating reaction of a secondary battery according to claim 6, wherein the calculation time calculates the time when a symbol of the cumulative current value changes as the critical time.

* * * * *